(12) United States Patent
Horino (10) Patent No.: US 8,928,849 B2
(45) Date of Patent: Jan. 6, 2015

(54) INPUT DEVICE AND METHOD OF MANUFACTURING INPUT DEVICE

(75) Inventor: Takenobu Horino, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 543 days.

(21) Appl. No.: 13/294,457

(22) Filed: Nov. 11, 2011

(65) Prior Publication Data

US 2012/0228106 A1    Sep. 13, 2012

(30) Foreign Application Priority Data

Mar. 9, 2011   (JP) ................. 2011-050942

(51) Int. Cl.
| | | |
|---|---|---|
| G02F 1/1345 | (2006.01) | |
| H01H 1/10 | (2006.01) | |
| H01R 13/62 | (2006.01) | |
| H05K 1/00 | (2006.01) | |
| H01H 11/06 | (2006.01) | |
| G06F 3/044 | (2006.01) | |

(52) U.S. Cl.
CPC .............. *H01H 11/06* (2013.01); *G06F 3/044* (2013.01); *G06F 2203/04103* (2013.01)
USPC ............ 349/149; 200/512; 439/329; 361/748

(58) Field of Classification Search
USPC .................. 349/149, 150, 192; 200/5 A, 512; 174/257, 258, 259, 260, 261, 262, 88 R; 439/329, 59, 62, 78, 79, 82; 361/748, 361/762, 765
See application file for complete search history.

(56) References Cited

U.S. PATENT DOCUMENTS

| | | | | |
|---|---|---|---|---|
| 4,697,885 A | * | 10/1987 | Minowa et al. | ............... 349/149 |
| 5,089,750 A | * | 2/1992 | Hatada et al. | .............. 315/169.3 |
| 5,317,438 A | * | 5/1994 | Suzuki et al. | ................. 349/192 |
| 2009/0115942 A1 | | 5/2009 | Watanabe | |
| 2009/0223723 A1 | | 9/2009 | Yang | |

FOREIGN PATENT DOCUMENTS

| | | |
|---|---|---|
| CN | 101297340 | 10/2008 |
| JP | 2002-250930 | 9/2002 |
| JP | 2010159334 | * 7/2010 |

OTHER PUBLICATIONS

Office Action in Chinese Application No. 201210052899.2 dated Aug. 25, 2014.

* cited by examiner

*Primary Examiner* — Renee Luebke
*Assistant Examiner* — Harshad Patel
(74) *Attorney, Agent, or Firm* — Beyer Law Group LLP (57) ABSTRACT

A method of manufacturing an input device includes a step of bonding a translucent first optical adhesive layer to one surface of a first transparent base so that a part of first lead electrodes is exposed to the outside; a step of disposing a FPC so that a predetermined gap is formed between the FPC and the first optical adhesive layer in plan view, and electrically connecting the FPC to the first lead electrodes exposed to one surface of the first transparent base; a step of bonding a surface member, which forms an input surface, to the first transparent base with the first optical adhesive layer interposed therebetween; and a step of sealing the exposed lead electrodes by injecting a resin into a space between the first transparent base and the surface member facing each other.

5 Claims, 11 Drawing Sheets

Related Art

FIG. 14

Related Art

FIG. 15

Related Art

INPUT DEVICE AND METHOD OF MANUFACTURING INPUT DEVICE

CLAIM OF PRIORITY

This application claims benefit of Japanese Patent Application No. 2011-050942 filed on Mar. 9, 2011, which is hereby incorporated by reference.

BACKGROUND OF THE INVENTION

1. Field of the Invention

The present invention relates to an input device and a method of manufacturing the input device, and more particularly, to an input device that can improve environmental resistance and a method of manufacturing the input device.

2. Description of the Related Art

Currently, a translucent input device is used as a display portion of an electronic device such as a mobile phone. An input device is disposed so as to overlap a display device such as liquid crystal, and a user can be in visual contact with an image, which is displayed on the display device, through the input device. Further, a user can input position information by touching an input region with a finger or an input tool.

Figure 13:
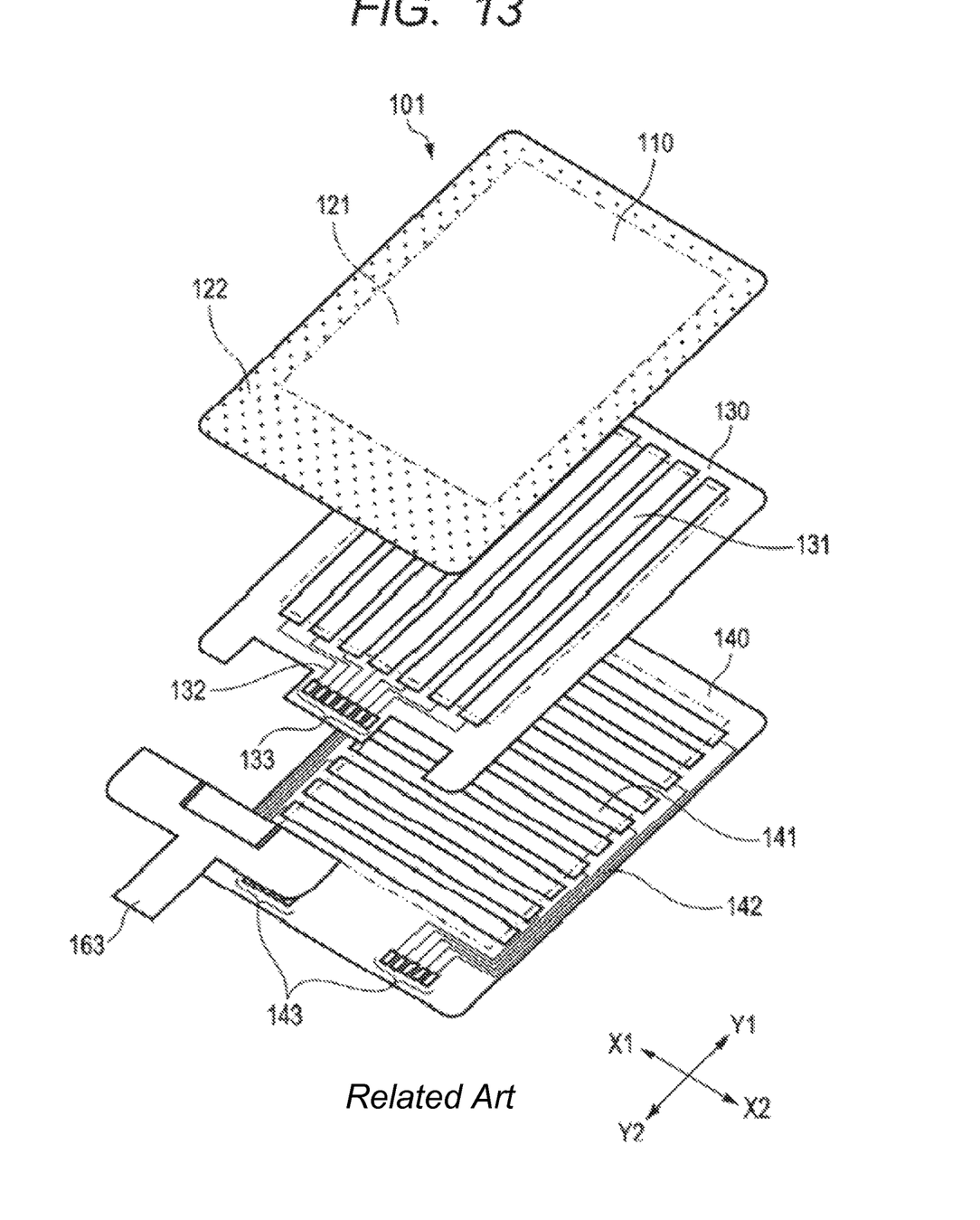
FIG. 13 is an exploded perspective view of an input device in the related art.

There are several types as the operation type of the input device. However, a capacitive input device is disclosed in, for example, Japanese Patent Application No. 2010-159334. FIG. 13 is an exploded perspective view of an input device 101 in the related art. In the capacitive input device 101, first and second transparent bases 130 and 140 are disposed so as to face each other and are bonded to each other with an optical adhesive layer (not shown) interposed therebetween. Further, a surface member 110, which protects the surface of the input device, is laminated on the surface of the first transparent base 130 close to an input surface, and is bonded to the first transparent base 130 with an optical adhesive layer (not shown) interposed therebetween.

First and second transparent electrode layers 131 and 141 are laminated on input regions 121 of the first and second transparent bases 130 and 140, respectively. Accordingly, when an operator makes a finger or the like be close to an arbitrary position on the input region 121, a value of capacitance between the transparent electrode layers is changed. The capacitive input device 101 can detect input position information on the basis of the change of the value of capacitance thereof.

As shown in FIG. 13, first and second connection electrodes 133 and 143 are provided in Y2-side portions of non-input regions 122 of the respective transparent bases, respectively. The first connection electrodes 133 are electrically connected to the first transparent electrode layer 131 through first lead electrodes 132 wired in the non-input region 122, and the second connection electrodes 143 are electrically connected to the second transparent electrode layer 141 through second lead electrodes 142. Further, the first and second connection electrodes 133 and 143 are connected to a flexible printed circuit board 163 (hereinafter, referred to as a FPC 163), so that input position information is output to the outside.

Figure 14:
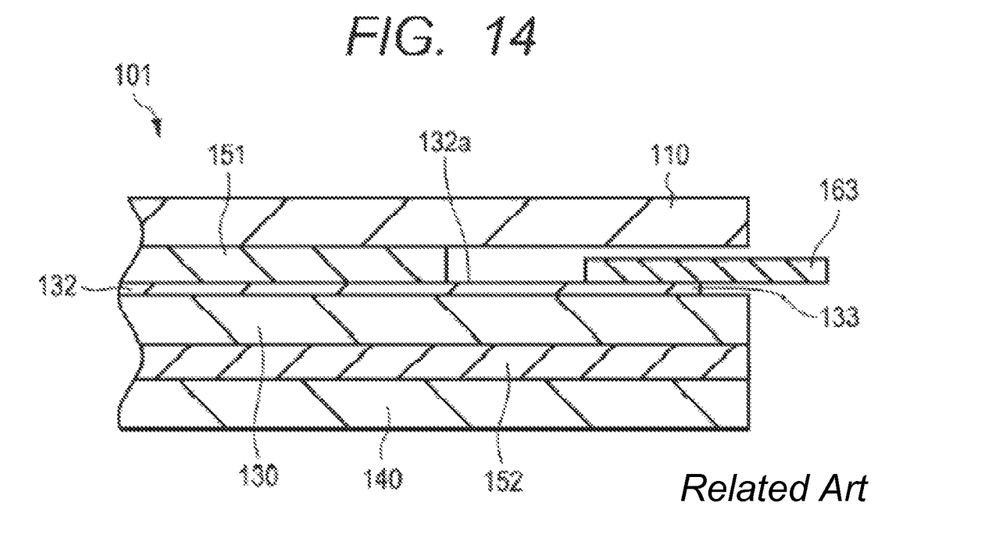
FIG. 14 is a schematic cross-sectional view of the vicinity of a connecting portion of the input device in the related art that is to be connected to a flexible printed circuit board.

In Japanese Patent Application No. 2010-159334, the detailed structures of the FPC 163 and the respective connection electrodes were not disclosed and problems in the vicinity of a connecting portion were not considered. FIG. 14 is a schematic cross-sectional view of the vicinity of the FPC 163 and the respective connection electrodes of the input device 101 in the related art. The FPC 163 is disposed so that a predetermined gap is formed between the FPC 163 and the first optical adhesive layer 151 in plan view. The FPC 163 is bonded to the connection electrodes in a space between the first transparent base 130 and the surface member 110 facing each other. Accordingly, exposed portions 132a of the lead electrodes are exposed to a space between the first optical adhesive layer 151 and the FPC 163 facing each other. The lead electrodes 132 are made of a conductive material, such as silver or copper. For this reason, since the exposed portions 132a of the lead electrodes are affected by humidity, temperature, and the like of external air, there is a concern that disconnection caused by corrosion, a short circuit caused by the attachment of foreign materials, and the like may occur. Further, when the input device 101 is used for an in-vehicle electronic device, stricter environmental resistance is required.

A method of applying a sealing resin so as to cover the exposed portions of the electrodes is known as a method of preventing the defects of the exposed portions of the electrodes. For example, Japanese Unexamined Patent Application Publication No. 2002-250930 discloses an invention, which protects the surface of a wiring pattern exposed to a space between a liquid crystal panel and a FPC by overcoating the surface of the wiring pattern with a sealing resin, as for a liquid crystal display device.

Figure 15:
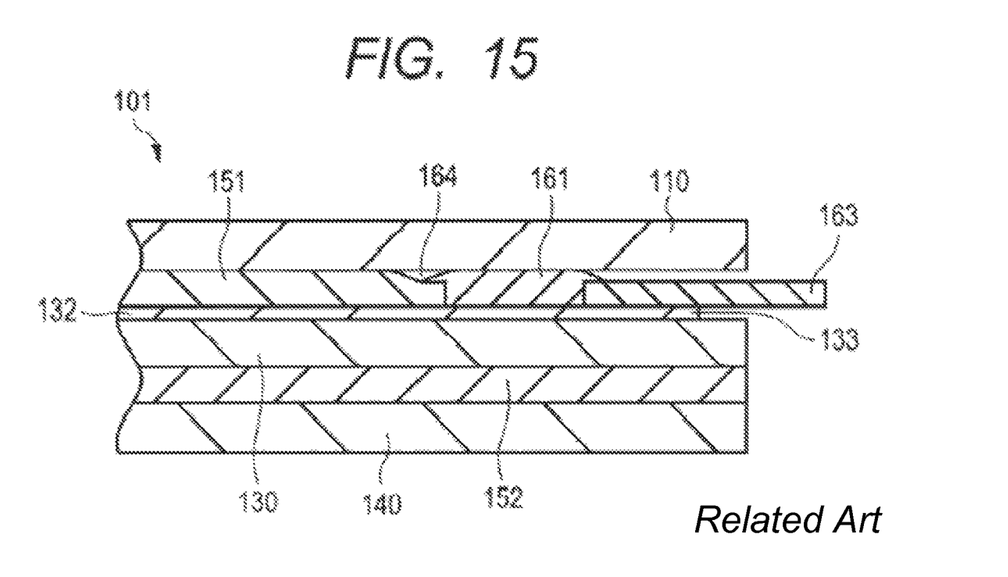
FIG. 15 is a schematic cross-sectional view illustrating a problem that is to be solved by the invention.

The inventor examined a method of improving the environmental resistance of the input device 101 in the related art by sealing the exposed portions 132a of the lead electrodes with a resin so that the exposed portions 132a of the lead electrodes are covered. FIG. 15 is a schematic cross-sectional view of the input device 101 in the related art where a sealing resin 161 is applied on the exposed portions 132a of the lead electrodes and the surface member 110 is bonded.

The input device 101 shown in FIG. 15 is made by bonding the first optical adhesive layer 151 and the FPC 163 to the first transparent base 130, applying the sealing resin 161 to the exposed portions 132a of the lead electrodes by a dispenser, and bonding the surface member 110 thereto. However, since it is difficult to apply the sealing resin 161 while accurately controlling the thickness of the sealing resin 161, the sealing resin 161 is applied with a large thickness. For this reason, there may be a case where a protrusive step is formed on the first optical adhesive layer 151. There is a problem that a blister 164 is generated between the first optical adhesive layer 151 and the surface member 110 as shown in FIG. 15 when the flat surface member 110 is bonded to the first optical adhesive layer 151 and the sealing resin 161 having the protrusive step. If the blister 164 is generated, not only appearance quality deteriorates but also a change in a distance between the input surface and the transparent electrode layer and a change in permittivity occur. For this reason, there is a possibility that the sensitivity of a sensor of the input device 101 may deteriorate.

SUMMARY OF THE INVENTION

The present invention provides an input device that can improve environmental resistance by suppressing the occurrence of the disconnection of lead electrodes, a short circuit, and the like and can prevent blisters from being generated between a surface member and an optical adhesive layer, and a method of manufacturing the input device.

According to an aspect of the invention, there is provided a method of manufacturing an input device that includes a transparent base having translucency, a transparent electrode layer provided in an input region of one surface of the transparent base, and lead electrodes electrically connected to the transparent electrode layer in a non-input region positioned around the input region. The method includes a step of bonding a translucent optical adhesive layer to one surface of the transparent base so that a part of the lead electrodes is exposed to the outside; a step of disposing a wiring member so that a predetermined gap is formed between the wiring member and the optical adhesive layer in plan view, and electrically connecting the wiring member to the lead electrodes exposed to one surface of the transparent base; a step of bonding a surface member, which forms an input surface, to the transparent base with the optical adhesive layer interposed therebetween; and a step of sealing the exposed lead electrodes by injecting a resin into a space between the transparent base and the surface member facing each other.

According to the method of manufacturing an input device of the aspect of the invention, it is possible to seal the exposed lead electrodes by injecting the resin into the space between the transparent base and the surface member facing each other. Accordingly, it is possible to suppress the occurrence of disconnection caused by the corrosion of the lead electrodes, a short circuit caused by the attachment of foreign materials, and the like, and to improve the environmental resistance of the input device. Further, since sealing is performed using the resin after the surface member is bonded to the transparent base with the optical adhesive layer interposed therebetween, it is possible to make the thickness of the resin be equal to or smaller than the thickness of the optical adhesive layer. Therefore, it is possible to suppress the generation of blisters between the surface member and the optical adhesive layer.

Moreover, the method of manufacturing an input device according to the aspect of the invention may further include a step of forming a through hole, which passes through the surface and the back surface of the transparent base, in the non-input region of the transparent base and sealing the exposed lead electrodes by injecting the resin from the through hole. According to this, it is possible to easily inject the resin through the through hole and to more reliably seal the exposed portions of the lead electrodes with the resin, so that it is possible to improve the environmental resistance of the input device.

The method of manufacturing an input device according to the aspect of the invention may further include a step of sealing exposed portions of the lead electrodes with the resin and filling the gap, which is formed between the wiring member and the optical adhesive layer facing each other, with the resin. Accordingly, it is possible to seal the entire space, to which the lead electrodes are exposed, with the resin, so that it is possible to more reliably improve the environmental resistance of the input device. Further, since the end portion of the wiring member facing the optical adhesive layer is fixed so as to be covered with the resin, it is possible to improve the connection reliability of the wiring member.

In the method of manufacturing an input device according to the aspect of the invention, an ultraviolet-curable resin may be used as the resin. According to this, heat does not need to be applied in a step of curing the resin and the resin can be cured in a short time. Accordingly, it is possible to reduce manufacturing costs. Furthermore, since residual stress at the time of curing is also small, it is possible to suppress the bending of the transparent base or the wiring member.

According to another aspect of the invention, there is provided an input device. The input device includes a surface member that forms an input surface, a transparent base having translucency, and an optical adhesive layer that bonds the surface member to the transparent base. A transparent electrode layer, which detects input position information, is provided in an input region of one surface of the transparent base, and lead electrodes electrically connected to the transparent electrode layer are provided in a non-input region positioned around the input region. The optical adhesive layer is laminated on one surface of the transparent base so that a part of the lead electrodes is exposed to the outside. A wiring member, which is electrically connected to the lead electrodes and led to the outside, is disposed in the non-input region so that a predetermined gap is formed between the wiring member and the optical adhesive layer in plan view. The lead electrodes, which are exposed to a space between the transparent base and the surface member facing each other, are sealed with a resin that is formed to have a thickness equal to or smaller than the thickness of the optical adhesive layer.

According to the input device of another aspect of the invention, the lead electrodes, which are exposed to the space between the transparent base and the surface member facing each other, are sealed with the resin. Accordingly, it is possible to suppress the occurrence of the disconnection of the lead electrodes caused by corrosion, a short circuit caused by the attachment of foreign materials, and the like, and to improve the environmental resistance of the input device. Further, since the thickness of the resin is equal to or smaller than that of the optical adhesive layer, it is possible to suppress the generation of blisters between the surface member and the optical adhesive layer.

Furthermore, in the input device according to another aspect of the invention, the through hole, which passes through the surface and the back surface of the transparent base, may be formed in the non-input region of the transparent base and the resin is continued to the through hole. According to this, since it is possible to inject the resin through the through hole, it is possible to more easily and reliably seal the lead electrodes.

Moreover, in the input device according to another aspect of the invention, the resin may seal the exposed lead electrodes, and a gap between the wiring member and the optical adhesive layer, which face each other, may be filled with the resin. Accordingly, it is possible to seal the entire space, to which the lead electrodes are exposed, with the resin, so that it is possible to more reliably improve the environmental resistance of the input device. Further, since the end portion of the wiring member facing the optical adhesive layer is fixed so as to be covered with the resin, it is possible to improve the connection reliability of the wiring member.

According to the input device and the method of manufacturing the input device of the aspects of the invention, it is possible to seal the exposed lead electrodes by injecting the resin into the space between the transparent base and the surface member. Accordingly, it is possible to suppress the occurrence of disconnection caused by the corrosion of the lead electrodes, a short circuit caused by the attachment of foreign materials, and the like, and to improve the environmental resistance of the input device. Further, since sealing is performed using the resin after the surface member is bonded to the transparent base with the optical adhesive layer interposed therebetween, it is possible to make the thickness of the resin be equal to or smaller than the thickness of the optical adhesive layer. Therefore, it is possible to suppress the generation of blisters between the surface member and the optical adhesive layer.

DESCRIPTION OF THE PREFERRED EMBODIMENTS

First Embodiment

Figure 1:
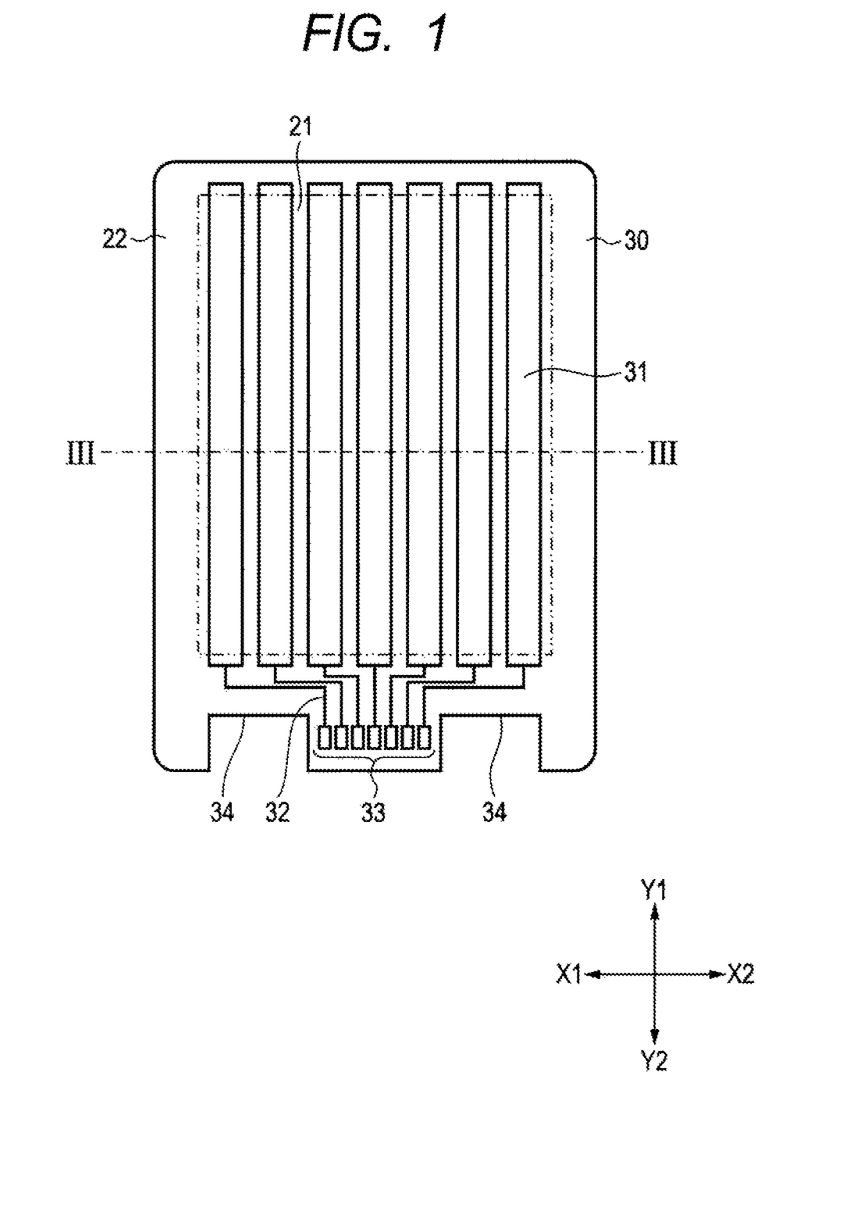
FIG. 1 is a plan view of a first transparent base of an input device according to a first embodiment.
Figure 2:
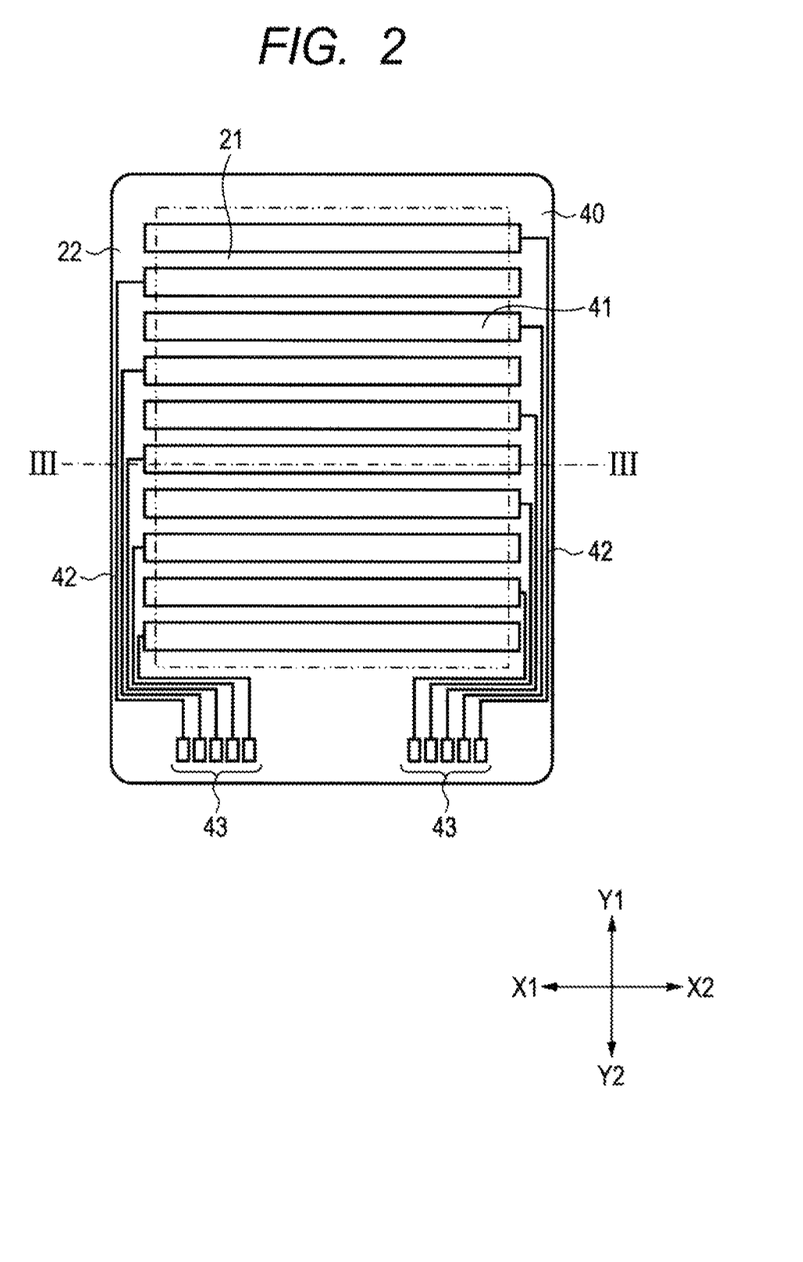
FIG. 2 is a plan view of a second transparent base of the input device according to the first embodiment.
Figure 3:
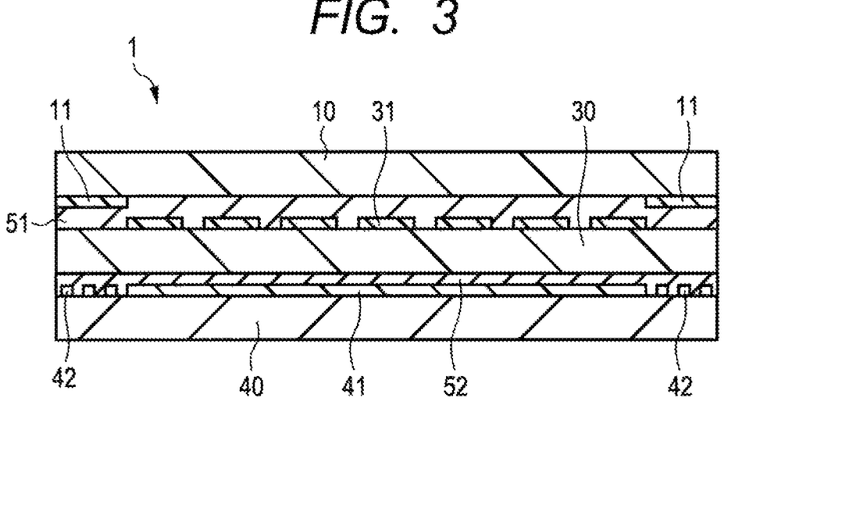
FIG. 3 is a cross-sectional view of the input device, where the respective transparent bases and a surface member are laminated, taken along a line III-III of FIGS. 1 and 2.

FIG. 1 is a plan view of a first transparent base 30 of an input device 1 according to a first embodiment. FIG. 2 is a plan view of a second transparent base 40 of the input device 1 according to the first embodiment. Further, FIG. 3 is a cross-sectional view of the input device 1, where the respective transparent bases and a surface member 10 are laminated and assembled, taken along a line III-III of FIGS. 1 and 2.

As shown in FIG. 1, a first transparent electrode layer 31, first lead electrodes 32, and first connection electrodes 33 are formed on one surface of the first transparent base 30. As shown in FIG. 1, the first transparent electrode layer 31 is formed of a plurality of strip-shaped bodies extending in a Y1-Y2 direction and the plurality of strip-shaped bodies are arranged parallel to each other at intervals in an X1-X2 direction.

The first transparent electrode layer 31 is formed in an input region 21 of the first transparent base 30, and a frame-like non-input region 22 is formed around the input region 21. The first lead electrodes 32 that are used to output input position information, and the first connection electrodes 33 that are to be connected to a flexible printed circuit board 63 (hereinafter, referred to as a FPC 63) are formed at a Y2-side portion of the non-input region 22. The first lead electrodes 32 are connected to Y2-side end portions of the first transparent electrode layer 31, are wired on the Y2-side portion of the non-input region 22, and are connected to the first connection electrodes 33.

As shown in FIG. 2, a second transparent electrode layer 41 is formed in an input region 21 of one surface of the second transparent base 40. The second transparent electrode layer 41 is formed of a plurality of strip-shaped bodies extending in the X1-X2 direction and the plurality of strip-shaped bodies are arranged parallel to each other at intervals in the Y1-Y2 direction.

Further, second lead electrodes 42, which are connected to X1-side end portions or X2-side end portions of the second transparent electrode layer 41, are formed in a non-input region 22. The second lead electrodes 42 are wired in the non-input region 22, and are connected to second connection electrodes 43 that are formed on a Y2-side portion of the non-input region 22.

As shown in FIGS. 1 and 2, the first and second connection electrodes 33 and 43 are formed parallel to each other in plan view when the first and second transparent bases 30 and 40 are laminated. Further, cut-out portions 34 are formed in a region of the first transparent base 30 that is to overlap with the second connection electrodes 43. Accordingly, when the input device 1 is assembled, the first and second connection electrodes 33 and 43 are arranged parallel to each other so as to be exposed to one surface of the input device. Accordingly, terminals formed on one surface of the FPC 63 can be connected to the respective exposed connection electrodes, so that it is possible to easily connect the input device to the FPC 63.

As shown in FIG. 3, the first and second transparent bases 30 and 40 are laminated so that the respective transparent electrode layers are positioned close to an input surface. The first and second transparent bases 30 and 40 are bonded to each other with a second optical adhesive layer 52 interposed therebetween. Each of the transparent bases and the second optical adhesive layer 52 is made of an insulating material, and capacitance is formed between the first and second transparent electrode layers 31 and 41. Further, the surface member 10, which forms the input surface, is laminated on the surface of the first transparent base 30, which is close to the input surface, with a first optical adhesive layer 51 interposed therebetween.

When a finger is close to or comes into contact with the input region 21 of the input surface at the time of the input operation of the capacitive input device 1 shown in FIG. 3, the capacitance between the finger and the first transparent electrode layer 31 is added to the capacitance between the first and second transparent electrode layers 31 and 41. Accordingly, the capacitance is changed. Further, an input position is calculated on the basis of the change of capacitance.

A resin material such as PET (polyethylene terephthalate), which has the shape of a transparent film, may be used for each of the first and second transparent bases 30 and 40. The thickness of each of the first and second transparent bases 30 and 40 is in the range of about 50 to 200 μm.

Further, each of the first and second transparent electrode layers 31 and 41 is formed of a transparent conductive film, which is made of ITO (Indium Tin Oxide), SnO2, ZnO, or the like having translucency in a visible light region. Each of the first and second transparent electrode layers 31 and 41 is formed by a thin-film method, such as a sputtering method or a deposition method, and is formed with a thickness of 0.01 to 0.05 μm, for example, about 0.02 μm. Further, each of the first and second transparent electrode layers 31 and 41 may be formed by a method of preparing a film where a transparent conductive film is previously formed and transferring only the transparent conductive film to a transparent base, or a method of applying a conductive polymer, Ag nanowires, or the like as a method other than the sputtering method, or the deposition method.

Each of the first and second lead electrodes 32 and 42 may be formed by a thin-film method, such as a sputtering method or a deposition method, with a conductive material, such as silver or copper. Alternatively, each of the first and second lead electrodes 32 and 42 may be formed by a printing method, such as screen printing, with conductive paste that is made of silver, copper, or the like.

An adhesive tape, which is made of an acrylic resin through which visible light passes, may be used as each of the first and second optical adhesive layers 51 and 52. In this embodiment, an adhesive tape having a thickness of about 50 to 100 μm is used for the first optical adhesive layer 51 and an adhesive tape having a thickness of about 25 to 100 μm is used for the second optical adhesive layer 52.

The surface member 10 is made of a translucent material. A resin board made of PC (polycarbonate), PET (polyethylene terephthalate), PEN (polyethylene naphthalate), PMMA (polymethylmethacrylate), or the like; or a glass substrate may be used as surface member 10. The surface member 10 is formed with a thickness of about 0.8 to 1.0 mm to protect the surface of the input device 1. Further, a decorative layer 11 is colored and formed in the non-input region 22 of the surface member 10. Accordingly, it is possible to prevent an operator from directly being in visual contact with the respective lead electrodes that are formed on the non-input region 22, the FPC 63, and the like. The decorative layer 11 may be formed by a printing method such as screen printing. The decorative layer 11 may be formed by in-mold molding or two-color molding with a resin material, other than the printing method. Alternatively, a composite board, which is formed of a transparent glass substrate and a colored resin board, may be used as the surface member 10.

Figure 4:
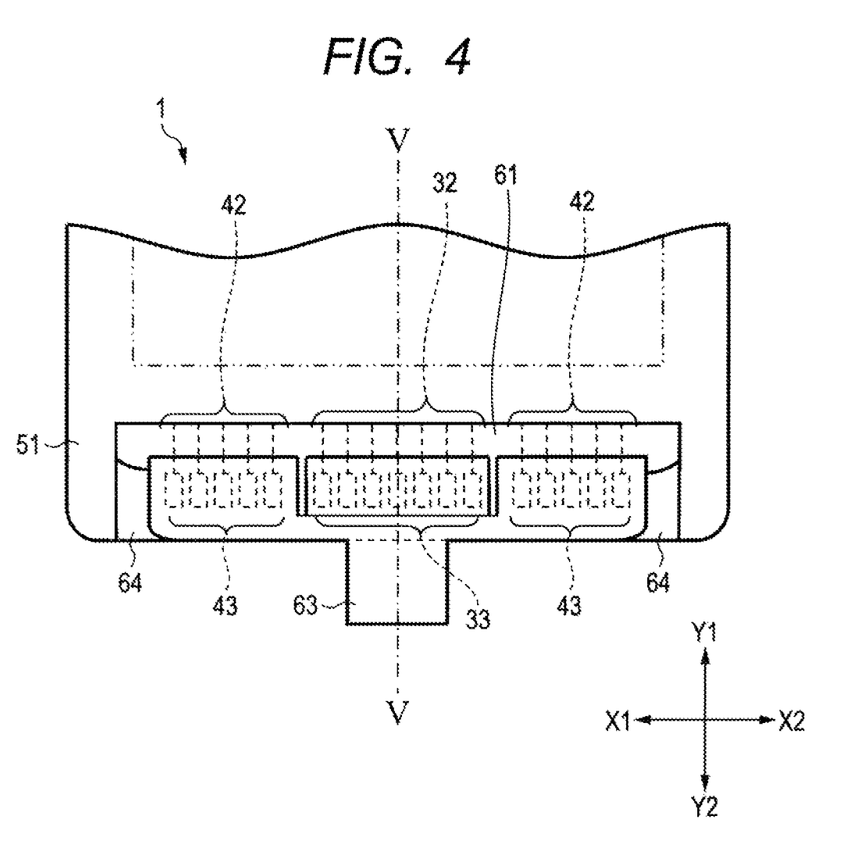
FIG. 4 is a schematic plan view of the vicinity of a connecting portion of the input device according to the first embodiment that is to be connected to a flexible printed circuit board.
Figure 5:
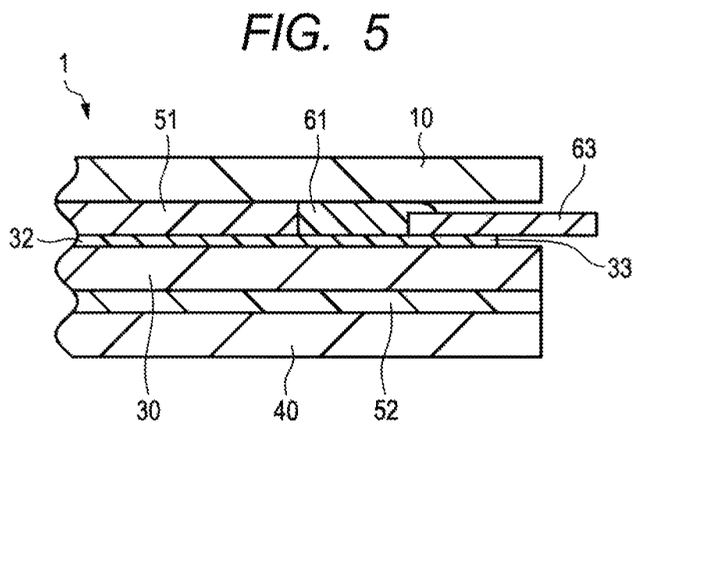
FIG. 5 is a schematic cross-sectional view of the vicinity of the connecting portion of the input device according to the first embodiment that is to be connected to a flexible printed circuit board.

FIG. 4 is a schematic plan view of the vicinity of a connecting portion of the input device 1 according to this embodiment that is to be connected to the FPC 63. FIG. 5 is a schematic cross-sectional view of the input device 1 taken along a line V-V of FIG. 4.

As shown in FIGS. 4 and 5, the first optical adhesive layer 51 is laminated on the first transparent base 30 so that a part of the respective lead electrodes and the first and second connection electrodes 33 and 43 are exposed to the outside. Further, the FPC 63 is disposed so that a predetermined gap is formed between the FPC 63 and the first optical adhesive layer 51 in plan view. The FPC 63 is electrically connected to the respective connection electrodes. The first optical adhesive layer 51 and the FPC 63 are disposed with a gap of, for example, about 0.5 to 2 mm, more preferably, a gap of about 1 to 1.2 mm interposed therebetween. Moreover, as shown in FIG. 5, a flexible printed circuit board thinner than the first optical adhesive layer 51 is used as the FPC 63 and the first transparent base 30 and the surface member 10, which face each other, can be connected to each other. An opening portion 64, which allows the inside and outside of the input device 1 to communicate with each other, is formed as shown in FIG. 4 for the connection of the FPC by this structure.

The FPC 63 is a wiring member where copper foil is laminated on one surface of a base film made of a polyimide resin so as to form a predetermined wiring pattern. Terminals, which are to be connected to the first and second connection electrodes 33 and 43 while facing the first and second connection electrodes 33 and 43, are formed at an end portion of the wiring pattern and the surfaces of the terminals are subjected to gold plating. Further, portions, which do not need to be exposed to the outside, of the wiring pattern except for the terminals are covered with a cover film. Meanwhile, the structure and material of the FPC 63 are not limited to the above description, and the FPC 63 may be any wiring member as long as the FPC 63 is connected to the respective connection electrodes so that input position information can be output to the outside.

Moreover, the respective connection electrodes and the FPC 63 are electrically connected to each other with an anisotropic conductive adhesive (not shown) interposed therebetween.

As shown in FIGS. 4 and 5, the respective lead electrodes, which are exposed to a space between the first transparent base 30 and the surface member 10 facing each other, are sealed with a sealing resin 61. Accordingly, it is possible to prevent the generation of migration, the corrosion of the lead electrodes, and the like even under an environment where temperature and humidity are high and to prevent the invasion of foreign materials from the outside. Therefore, it is possible to suppress the occurrence of the disconnection of the lead electrodes and a short circuit, so that it is possible to improve the environmental resistance of the input device 1.

The sealing resin 61 may be injected with pressure from the opening portion 64 by a dispenser. Further, it is preferable that a resin, which is excellent in humidity resistance and the adherence to the first transparent base 30, the surface member 10, and the like, be used as the sealing resin 61. For example, a resin suitable for the sealing resin 61 may be selected from an acrylic resin, an epoxy resin, and the like other than a silicon resin.

As shown in FIG. 5, the sealing resin 61 is filled in a gap between the first optical adhesive layer 51 and the FPC 63, which face each other, so as not to overlap with the first optical adhesive layer 51. Accordingly, the environmental resistance of the input device 1 is improved and the adhesion between the FPC 63 and the respective connection electrodes is reinforced, so that it is possible to improve the connection reliability of the FPC 63.

However, the invention is not limited thereto. If the sealing resin 61 is formed to have a thickness smaller than the thickness of the first optical adhesive layer 51 and is provided to coat the exposed portions of the lead electrodes as shown in a modification of this embodiment shown in FIG. 6, it is possible to improve the environmental resistance of the input device 1.

Figure 6:
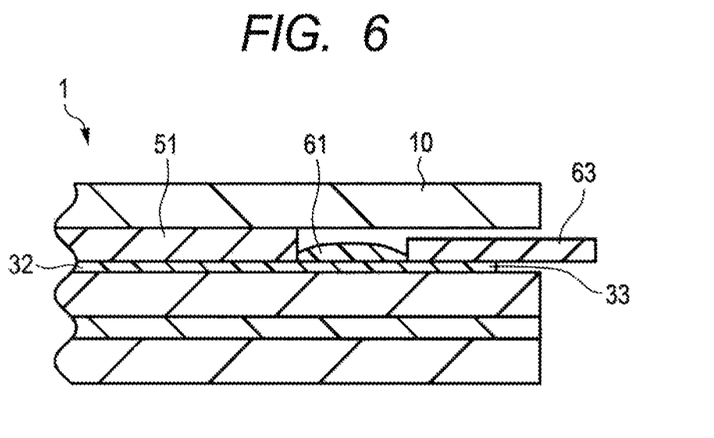
FIG. 6 is a schematic cross-sectional view of a modification of the input device according to the first embodiment.

Further, the sealing resin 61 is formed to have a thickness, which is equal to or smaller than the thickness of the first optical adhesive layer 51, as shown in FIGS. 5 and 6. Accordingly, the sealing resin 61 does not form a protrusive step on the first optical adhesive layer 51, so that it is possible to prevent blisters from being generated between the surface member 10 and the first optical adhesive layer 51. Therefore, the input device 1 according to this embodiment can improve environmental resistance without deteriorating the appearance quality and the sensitivity of a sensor.

Next, a method of manufacturing the input device 1 according to this embodiment will be described. FIGS. 7A, 7B, 8A, and 8B are views illustrating steps of a method of manufacturing the input device 1 and are schematic cross-sectional views of the vicinity of a connecting portion between the input device 1 and the FPC 63.

Figure 7A:
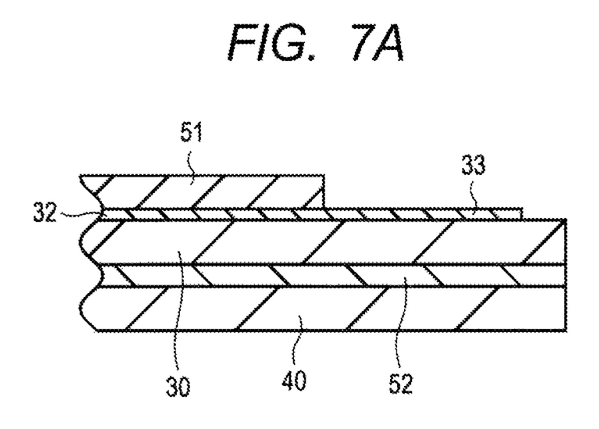
FIGS. 7A and 7B are views illustrating steps of a method of manufacturing the input device according to the first embodiment.

First, in a step illustrated in FIG. 7A, the first optical adhesive layer 51 is bonded to the first transparent base 30 where the first transparent electrode layer 31 (not shown), the first lead electrodes 32, and the first connection electrodes 33 have been formed on one surface. The first optical adhesive layer 51 is disposed so that a part of the first lead electrodes 32 is exposed to the outside.

Figure 7B:
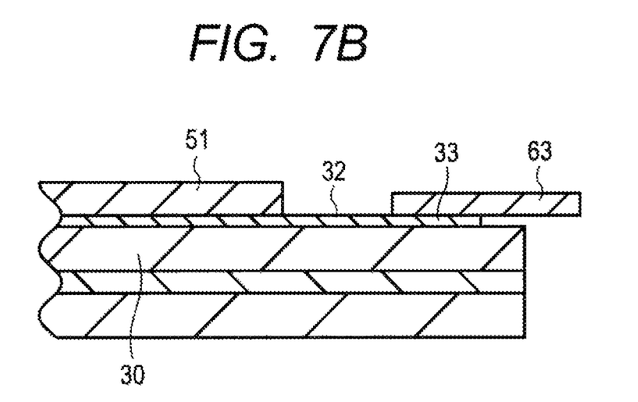

Next, in a step illustrated in FIG. 7B, the FPC 63 is disposed so that a predetermined gap is formed between the FPC 63 and the first optical adhesive layer 51 in plan view, and the FPC 63 is connected to the first and second connection electrodes 33 and 43 (not shown) exposed to one surface of the first transparent base 30. Accordingly, while the first lead electrodes 32 are exposed to the space between the first optical adhesive layer 51 and the FPC 63 facing each other, the FPC 63 is electrically connected to the first and second lead electrodes 32 and 42 (not shown).

Meanwhile, the FPC 63 is bonded to the respective connection electrodes through thermal compression with an anisotropic conductive adhesive (not shown) interposed therebetween. In a thermal compression step, the anisotropic conductive adhesive may be extruded and squeezed into a gap between the FPC 63 and the first optical adhesive layer 51 that face each other. In this case, if the anisotropic conductive adhesive rides on the first optical adhesive layer 51, there is a possibility that the appearance quality may deteriorate due to blisters generated when the surface member 10 is bonded in the subsequent step. Further, there is a concern that the change of a distance between the transparent electrode layer and the surface (input surface) of the surface member 10 or the change of permittivity may cause the reduction of the sensitivity of a sensor. Accordingly, it is preferable that the first optical adhesive layer 51 and the FPC 63 be disposed with a gap of, for example, about 0.5 to 2 mm, more preferably, a gap of about 1 to 1.2 mm interposed therebetween.

Figure 8A:
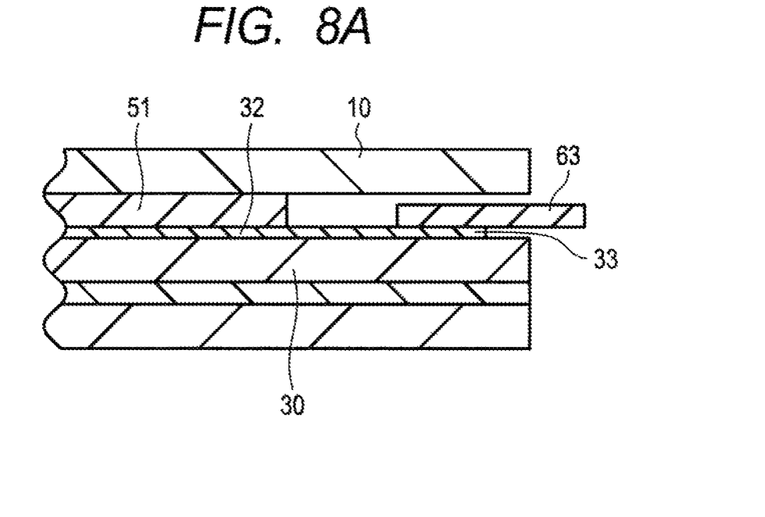
FIGS. 8A and 8B are views illustrating steps of the method of manufacturing the input device according to the first embodiment.

Next, in a step illustrated in FIG. 8A, the surface member 10 is bonded to the first transparent base 30 with the first optical adhesive layer 51 interposed therebetween. The surface member 10 protects the surface of the input device 1, and is laminated and protrudes more than the first optical adhesive layer 51 so that an operator is not in visual contact with the respective lead electrodes and the FPC 63.

Figure 8B:
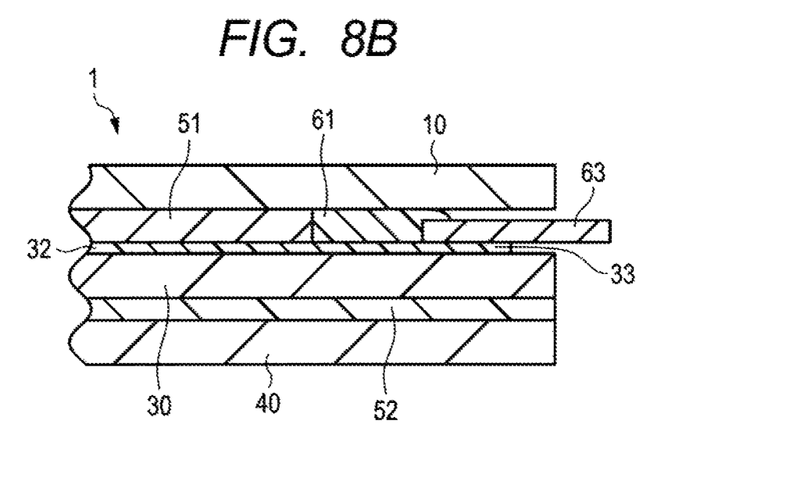

Further, as shown in FIG. 8B, the sealing resin 61 is injected into the space between the first transparent base 30 and the surface member 10 facing each other, and seals the first and second lead electrodes 32 and 42 that are exposed to the outside. The sealing resin 61 may be injected from the opening portion 64, which is formed between the first optical adhesive layer 51 and the FPC 63 shown in FIG. 4, by a dispenser. A method of injecting the sealing resin 61 with pressure or a method of injecting the sealing resin 61 using the flowability of the sealing resin 61 may be used as a method of injecting the sealing resin 61. Further, if the sealing resin 61 is sucked from the other side of the opening portion 64 while being injected from one side of the opening portion 64, the time required for a manufacturing process can be reduced. Therefore, it is possible to reduce manufacturing costs.

It is preferable that an ultraviolet-curable resin be used as the sealing resin 61. For example, the sealing resin 61 may be selected from an acrylic ultraviolet-curable resin, an epoxy ultraviolet-curable resin, and the like. If an ultraviolet-curable resin is used as the sealing resin 61, it is not necessary to heat the sealing resin 61 to cure the sealing resin 61 and it is possible to cure the sealing resin 61 in a short time. Accordingly, it is possible to reduce manufacturing costs. Moreover, temperature change or volume contraction is less during the curing of the sealing resin 61 and residual stress is also less after the curing of the sealing resin 61, so that it is possible to more reliably seal the first and second lead electrodes 32 and 42 for a long time. Therefore, it is possible to improve the environmental resistance of the input device 1.

According to the method of manufacturing the input device 1 of this embodiment, it is possible to easily and reliably seal the respective exposed connection electrodes. For this reason, it is possible to suppress the occurrence of disconnection caused by the corrosion of the lead electrodes and a short circuit caused by the attachment of foreign materials, and to improve the environmental resistance of the input device 1. Further, since the respective exposed connection electrodes are sealed with the sealing resin 61 after the surface member 10 is bonded to the first transparent base 30 with the first optical adhesive layer 51 interposed therebetween, the sealing resin 61 is not laminated so as to ride on the first optical adhesive layer 51 and the sealing resin 61 does not become thicker than the first optical adhesive layer 51, so that a protrusive step is not formed. Therefore, the generation of blisters between the surface member 10 and the first optical adhesive layer 51 is suppressed.

Second Embodiment

Figure 9:
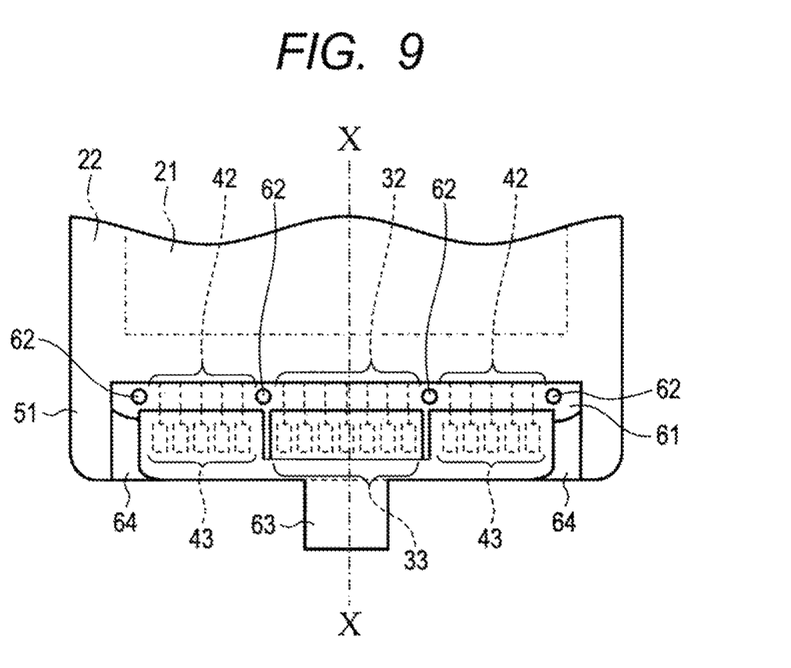
FIG. 9 is a schematic plan view of the vicinity of a connecting portion of an input device according to a second embodiment that is to be connected to a flexible printed circuit board.
Figure 10:
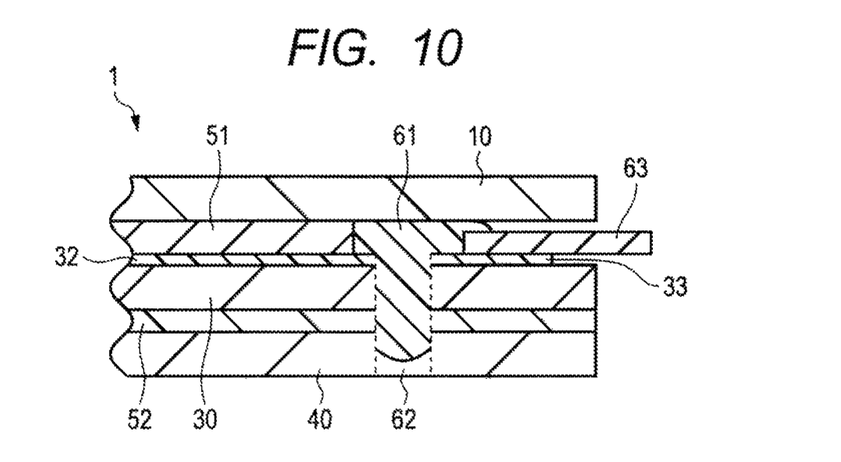
FIG. 10 is a schematic cross-sectional view of the input device taken along a line X-X of FIG. 9.

FIG. 9 is a schematic plan view of the vicinity of a connecting portion of an input device 1 according to a second embodiment that is to be connected to an FPC 63. FIG. 10 is a schematic cross-sectional view of the input device 1 taken along a line X-X of FIG. 9. Meanwhile, the same components as the components of the first embodiment are denoted by the same reference numerals and the detailed description thereof will be omitted.

As in the first embodiment, in the input device 1 according to this embodiment, first and second transparent bases 30 and 40 and a surface member 10 are laminated with first and second optical adhesive layers 51 and 52 interposed therebetween. Further, a transparent electrode layer, lead electrodes, and connection electrodes are formed on each of the first and second transparent bases 30 and 40.

As shown in FIGS. 9 and 10, the first optical adhesive layer 51 and the FPC 63 are disposed on one surface of the first transparent base 30 with a predetermined gap interposed therebetween. First lead electrodes 32, which are exposed to a space between the first optical adhesive layer 51 and the FPC 63 facing each other, are sealed with a sealing resin 61.

As shown in FIGS. 9 and 10, through holes 62, which pass through the surface and the back surface of a non-input region 22 between the first optical adhesive layer 51 and the FPC 63, are formed at the first and second transparent bases 30 and 40 of this embodiment. Moreover, as shown in FIG. 10, the sealing resin 61 seals the first lead electrodes 32 and is formed continuously from the through holes 62. Meanwhile, FIG. 10 is a schematic cross-sectional view illustrating the through holes 62 and the sealing resin 61, and the through holes 62 are formed at positions that do not overlap with the line X-X and the first lead electrodes 32 in plan view as shown in FIG. 9.

Since it is possible to inject the sealing resin 61 through the through holes 62 in this embodiment, it is possible to more easily and reliably seal the exposed portions of the first lead electrodes 32. Therefore, it is possible to improve the environmental resistance of the input device 1. Further, even when one through hole 62 is formed, it is possible to obtain the effect of the through hole 62. However, it is preferable that a plurality of through holes 62 be formed as shown in FIG. 9. Accordingly, it is possible to seal a region, which is to be sealed, by reliably injecting the sealing resin 61 to the region, so that it is possible to further improve the environmental resistance of the input device 1.

Furthermore, since the through holes 62 are formed, it is possible to easily control the thickness of the sealing resin 61. Therefore, various materials may be selected in terms of the kind, viscosity, or the like of the sealing resin 61. In addition, the sealing resin 61 does not form a protrusive step on the first optical adhesive layer 51, so that it is possible to more reliably prevent blisters from being generated between the surface member 10 and the first optical adhesive layer 51. Therefore, the input device 1 according to this embodiment can improve environmental resistance without deteriorating the appearance quality and the sensitivity of a sensor.

In this embodiment, a gap between the first optical adhesive layer 51 and the FPC 63 is in the range of about 1.0 to 1.2 mm. In this case, it is preferable that the diameter of each of the through holes 62 be about 0.8 mm. Accordingly, it is possible to easily inject the sealing resin 61 without increasing the area of the non-input region 22.

Meanwhile, it is possible to seal the exposed portions of the first lead electrodes 32 with the sealing resin 61 and to fill the gap between the first optical adhesive layer 51 and the FPC 63, which face each other, with the sealing resin 61 as shown in FIG. 10. Accordingly, the environmental resistance of the input device 1 is improved and the adhesion between the FPC 63 and the respective connection electrodes is reinforced, so that it is possible to improve the connection reliability of the FPC 63. Further, if the first lead electrodes 32 are covered even though the sealing resin 61 is formed thinner than the first optical adhesive layer 51, it is possible to improve the environmental resistance of the input device 1.

Next, a method of manufacturing the input device 1 according to this embodiment will be described with reference to FIGS. 11A, 11B, 12A, and 12B.

Figure 11A:
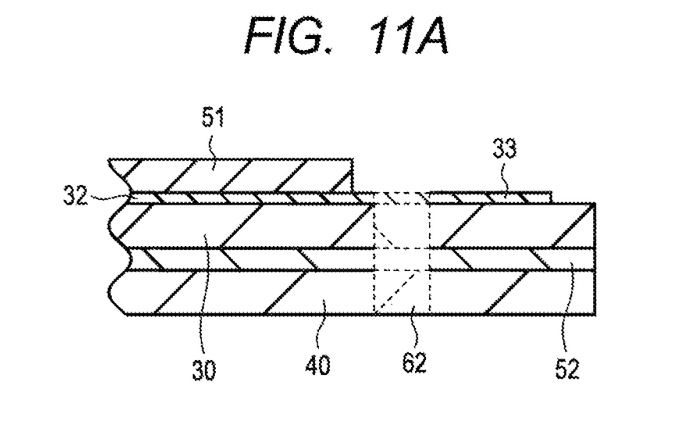
FIGS. 11A and 11B are views illustrating steps of a method of manufacturing the input device according to the second embodiment.
Figure 11B:
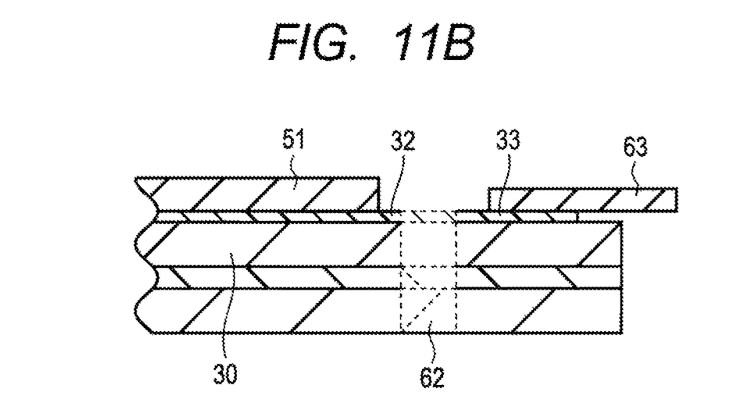

In a step of FIG. 11A, the first optical adhesive layer 51 is bonded to one surface of the first transparent base 30 where the through holes 62 passing through the surface and the back surface are formed so that a part of the first lead electrodes 32 and the through holes 62 are exposed to the outside. Next, in a step of FIG. 11B, the FPC 63 is disposed so that a predetermined gap is formed between the FPC 63 and the first optical adhesive layer 51 in plan view. A part of the first lead electrodes 32 and the through holes 62 are exposed to the outside between the first optical adhesive layer 51 and the FPC 63 that face each other.

Even in this embodiment, it is preferable that the first optical adhesive layer 51 and the FPC 63 be disposed with a gap of, for example, about 0.5 to 2 mm, more preferably, a gap of about 1 to 1.2 mm interposed therebetween.

Figure 12A:
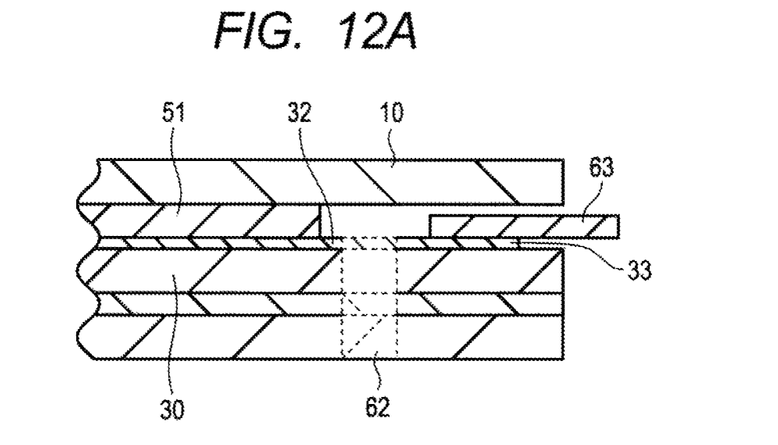
FIGS. 12A and 12B are views illustrating steps of the method of manufacturing the input device according to the second embodiment.

Next, in a step of FIG. 12A, the surface member 10 is laminated on one surface of the first transparent base 30 with the first optical adhesive layer 51 interposed therebetween. The surface member 10 is laminated and protrudes more than the first optical adhesive layer 51 so as to face the FPC 63 and the respective connection electrodes.

Figure 12B:
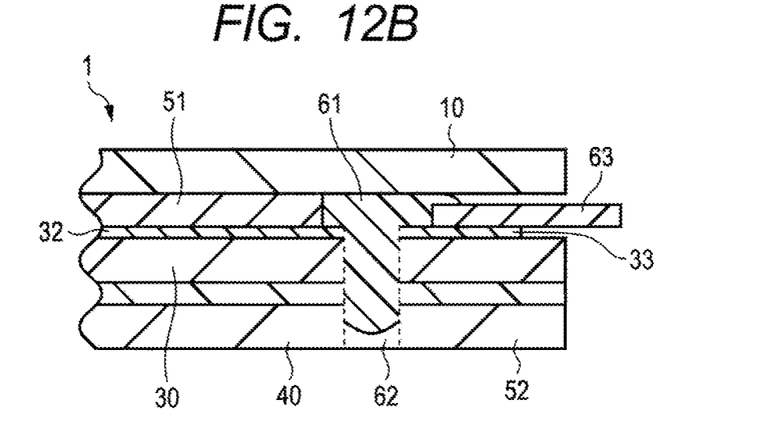

In a step of FIG. 12B, the sealing resin 61 is injected into the space between the first transparent base 30 and the surface member 10 facing each other, and seals the first and second lead electrodes 32 and 42 that are exposed to the outside. The sealing resin 61 may be injected with pressure from the through holes 62 by a dispenser or the like. Further, if the sealing resin 61 is sucked from the opening portion 64 shown in FIG. 9 while being injected from the through holes 62 by the dispenser or the like, it is possible to uniformly fill the gap between the first optical adhesive layer 51 and the FPC 63 in a shorter time. Alternatively, if a resin material, which has excellent flowability and excellent wettability with the first transparent base 30, is used as the sealing resin 61, it is possible to seal the electrodes by making the resin material wet and spread on the surfaces of the respective exposed connection electrodes and the first transparent base 30.

Even in the method of manufacturing the input device 1 according to this embodiment, it is possible to seal the electrodes by injecting a resin from the through holes 62 after the surface member 10 is bonded to the first transparent base 30 with the first optical adhesive layer 51 interposed therebetween. Accordingly, it is possible to prevent the sealing resin 61 from becoming thicker than the first optical adhesive layer 51 and to suppress the generation of blisters between the surface member 10 and the first optical adhesive layer 51. Therefore, according to the method of manufacturing the input device 1 of this embodiment, it is possible to provide an input device 1 that can improve environmental resistance without deteriorating the appearance quality and the sensitivity of a sensor.

Meanwhile, in the input devices 1 according to the first and second embodiments of the invention, the respective transparent electrode layers have been formed of patterns extending in the X or Y direction. However, the transparent electrode layers are not limited to the patterns. The advantages of the invention are obtained in the same manner even in an input device of which transparent electrode layers are formed of, for example, so-called diamond patterns formed by connecting rhombic patterns. Further, the invention is not limited to the structure using two transparent bases, and the invention may also be applied to an input device having a structure where a transparent electrode layer is formed so as to have capacitance by using one transparent base.

It should be understood by those skilled in the art that various modifications, combinations, sub-combinations and alterations may occur depending on design requirements and other factors insofar as they are within the scope of the appended claims of the equivalents thereof.

What is claimed is:

1. An input device comprising:
   a surface member including an input surface;
   a transparent base, including:
      a transparent electrode layer provided in an input region of a first surface of the transparent base, the transparent electrode layer being configured to detect input position information; and
      lead electrodes electrically connected to the transparent electrode layer and provided in a non-input region of the first surface positioned around the input region;
   an optical adhesive layer bonding the surface member over the first surface of the transparent base so that a part of the lead electrodes is exposed on the first surface;
   a wiring member electrically connected to the part of the lead electrodes and led to the outside, the wiring member being disposed in the non-input region so that a predetermined gap is formed between the wiring member and the optical adhesive layer, the part of the lead electrodes being exposed on the first surface in the gap; and
   a resin formed in the gap so as to seal the exposed part of the lead electrodes, the resin having a thickness equal to or smaller than a thickness of the optical adhesive layer.

2. The input device according to claim 1, further comprising:
   a through hole formed in the non-input region of the transparent base through the transparent base from the first surface to a second surface opposite to the first surface of the transparent base,
   wherein the resin is continually provided from the gap to the through hole.

3. The input device according to claim 1,
   wherein the resin fills a space formed between the surface member and the first surface of the transparent member which face each other in the gap.

4. The input device according to claim 2,
wherein the resin fills a space formed between the surface member and the first surface of the transparent member which face each other in the gap.

5. The input device according to claim 1, wherein the resin does not overlap with the optical adhesive layer.

\* \* \* \* \*